United States Patent
Milojevic et al.

(10) Patent No.: US 8,598,560 B1
(45) Date of Patent: Dec. 3, 2013

(54) RESISTIVE MEMORY ELEMENTS EXHIBITING INCREASED INTERFACIAL ADHESION STRENGTH, METHODS OF FORMING THE SAME, AND RELATED RESISTIVE MEMORY CELLS AND MEMORY DEVICES

(75) Inventors: Marko Milojevic, Boise, ID (US); John A. Smythe, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/547,270

(22) Filed: Jul. 12, 2012

(51) Int. Cl.
 *H01L 29/00* (2006.01)
 *H01L 29/02* (2006.01)
 *H01L 29/04* (2006.01)
 *H01L 47/00* (2006.01)
 *H01L 21/8236* (2006.01)
 *G11C 11/00* (2006.01)

(52) U.S. Cl.
 USPC ....... 257/2; 257/1; 257/3; 257/4; 257/E45.01; 438/278; 438/382; 365/148

(58) Field of Classification Search
 USPC ............ 257/1, 2, 3, 4, E45.01; 438/382, 278; 365/148
 See application file for complete search history.

(56) References Cited

U.S. PATENT DOCUMENTS

| | | | |
|---|---|---|---|
| 7,129,133 B1 | 10/2006 | Avanzino et al. | |
| 7,141,482 B1 | 11/2006 | Avanzino | |
| 7,573,133 B2 | 8/2009 | Cohen | |
| 7,709,958 B2 | 5/2010 | Cohen | |
| 7,888,842 B2 * | 2/2011 | Pereira da Cunha et al. | 310/324 |
| 2006/0189084 A1 * | 8/2006 | Mizuguchi et al. | 438/278 |
| 2009/0020740 A1 * | 1/2009 | Chien et al. | 257/2 |
| 2010/0195371 A1 * | 8/2010 | Ohba et al. | 365/148 |
| 2011/0073825 A1 | 3/2011 | Aratani et al. | |
| 2011/0181318 A1 * | 7/2011 | Kamins | 326/40 |
| 2012/0252184 A1 * | 10/2012 | Ninomiya et al. | 438/382 |

FOREIGN PATENT DOCUMENTS

WO 2011065994 A2 6/2011

OTHER PUBLICATIONS

Achamma et al., Glass Transformation Studies in Ge—Se—Bi System, ISSN 1087-6596, Glass Physics and Chemistry, vol. 33, No. 6 (2007) pp. 562-568.

* cited by examiner

*Primary Examiner* — Ha Tran T Nguyen
*Assistant Examiner* — Thai T Vuong
(74) *Attorney, Agent, or Firm* — TraskBritt

(57) ABSTRACT

A resistive memory element comprising a conductive material, an active material over the conductive material, and an ion source material on the active material and comprising at least one chalcogen, at least one active metal, and at least one additional element. Additional resistive memory elements, as well as methods of forming resistive memory elements, and related resistive memory cells and resistive memory devices are also described.

22 Claims, 16 Drawing Sheets

RESISTIVE MEMORY ELEMENTS EXHIBITING INCREASED INTERFACIAL ADHESION STRENGTH, METHODS OF FORMING THE SAME, AND RELATED RESISTIVE MEMORY CELLS AND MEMORY DEVICES

TECHNICAL FIELD

Embodiments of the disclosure relate to the field of semiconductor device design and fabrication. More specifically, embodiments of the disclosure relate to resistive memory elements exhibiting increased interfacial adhesion strength, to methods of forming such resistive memory elements, and to memory cells and memory devices incorporating such resistive memory elements.

BACKGROUND

Resistive memory cells, such as resistive random access memory (RRAM) cells, store data by switching between electrical resistance states. For example, for binary data storage, a high-resistance state of the resistive memory cell may be read as logical "1," while a low-resistance state of the resistive memory cell may be read as logical "0." Switching between resistance states may be achieved by applying different physical signals (e.g., voltage, current, etc.) across the resistive memory cell to form, at least partially remove, or repair conductive filaments or bridges in a resistive memory element. Forming the conductive filaments can decrease the resistance of the memory cell, removing the conductive filaments can increase the resistance of the memory cell, and repairing the conductive filaments can decrease the resistance of the memory cell once again. Conventionally, the initial formation of the conductive filaments is referred to as "forming," the at least partial removal of the conductive filaments is referred to as "resetting," and the repair of the conductive filaments is referred to as "setting."

An example of an RRAM cell is a conductive bridge random access memory cell. In a conventional conductive bridge random access memory cell, the resistive memory element includes a conductive material (also referred to as an "inert electrode"), an active material, and an ion source material (also referred to as an "active electrode"). The active material may be on the conductive material, and the ion source material may be on the active material. The ion source material includes an active metal, such as copper (Cu), silver (Ag), or zinc (Zn). The conductive filament is formed and/or set by the movement of Cu, Ag, or Zn cations (e.g., by application of a voltage across the ion source material) from the ion source material, through the active material, and to the conductive material, where the Cu, Ag, or Zn cations are electrochemically reduced and deposited until a path of less resistance (i.e., the conductive filament) is formed across the active material. The conductive filament can be reset (e.g., by applying a voltage with reversed polarity across the ion source material) by ionizing and returning the Cu, Ag, or Zn atoms to the ion source material, or can remain in place indefinitely without needing to be electrically refreshed or rewritten.

Unfortunately, internal stresses in the materials (e.g., the ion source material) of conventional resistive memory elements, combined with the characteristics of interfaces between the materials, may cause delamination of adjacent materials. Delamination may, for example, occur during subsequent processing of the resistive memory element or RRAM cell, such as during subsequent thermal anneal processing. If adjacent materials delaminate or detach, successful fabrication of the RRAM cell or the RRAM device may be hindered or precluded and/or the fabricated RRAM cell or RRAM device may exhibit at least one of performance and durability problems.

It would, therefore, be desirable to have a resistive memory element, for example, a resistive memory element of a conductive bridge random access memory cell, exhibiting increased interfacial adhesion (e.g., as-deposited, following subsequent processing, and during normal use and operation) between adjacent materials of the memory element. It would also be desirable if the resistive memory element exhibited improvements in material smoothness and in at least one electrical property.

DETAILED DESCRIPTION

Figure 1:
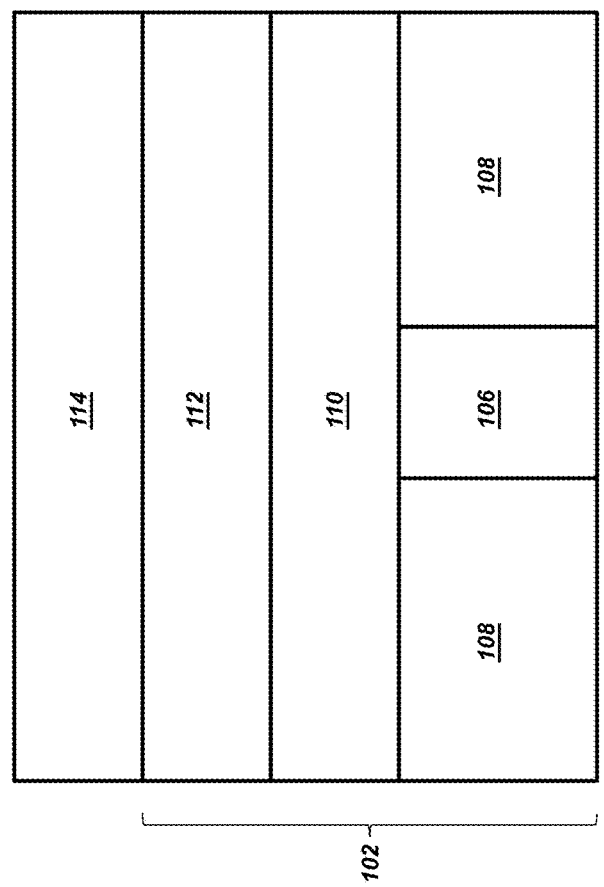
FIG. 1 is a cross-sectional view of a resistive memory element, in accordance with an embodiment of the disclosure.

Resistive memory elements exhibiting increased interfacial adhesion strength, methods of forming such resistive memory elements, and memory cells and memory devices incorporating such resistive memory elements are disclosed. A resistive memory element of the disclosure may include a conductive material, an active material, and an ion source material.

In some embodiments, the ion source material may include at least one chalcogen, at least one active metal, and at least one additional element. For certain ratios of chalcogen content to active metal content, the additional element may facilitate increased adhesion strength between the ion source material and each of the active material and an electrode material as compared to conventional ion source materials lacking the additional element. The additional element may facilitate reduced internal stress, increased thermal budget, increased smoothness, and improved electrical characteristics (e.g., increased active metal content) for the ion source material.

In additional embodiments, the resistive memory element may further include an interfacial material between the active material and the ion source material, and, optionally, another interfacial material between the ion source material and the electrode material. The interfacial material and, optionally, the another interfacial material may facilitate increased adhesive strength at interfaces of the ion source material while enabling an amount of the additional element in the ion source material to be reduced or eliminated. The resistive memory elements of the disclosure may be incorporated into resistive memory cells and resistive memory devices to improve performance and durability as compared to conventional resistive memory cells and conventional resistive memory devices.

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the industry. In addition, the description provided herein does not form a complete process flow for forming a resistive memory element, and each of the resistive memory elements, resistive memory cells, and resistive memory devices described below do not form a complete semiconductor device. Only those process acts and structures necessary to understand the embodiments of the present disclosure are described in detail below.

In the following description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular memory cell, memory array, or memory device, but are merely idealized representations that are employed to describe embodiments of the present disclosure. The drawings presented herein are not necessarily drawn to scale. Additionally, elements common between drawings may retain the same numerical designation.

As used herein, the term "substrate" means and includes a base material or construction upon which additional materials are formed. The substrate may be a semiconductor substrate, a base semiconductor layer on a supporting structure, a metal electrode or a semiconductor substrate having one or more layers, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, relational terms, such as "first," "second," "top," "bottom," "upper," "lower," "over," "under," etc., are used for clarity and convenience in understanding the disclosure and accompanying drawings and do not connote or depend on any specific preference, orientation, or order, except where the context clearly indicates otherwise.

As used herein, the term "substantially," in reference to a given parameter, property, or condition, means to a degree that one skilled in the art would understand that the given parameter, property, or condition is met with a small degree of variance, such as within acceptable manufacturing tolerances.

With the description as provided below, it will be readily apparent to one of ordinary skill in the art that the structures and methods described herein may be used in various applications. For example, the structures and methods of the disclosure may be used in any ovonic threshold switching application where it is desired to enhance the adhesion strength of a chalcogenide material with at least one other material.

One embodiment of the disclosure will now be described with reference to FIG. 1, which illustrates resistive memory element 102, such as a conductive bridge random access memory element, coupled to an electrode material 114. The resistive memory element 102 may include a conductive material 106, an active material 110, and an ion source material 112. As depicted in FIG. 1, the conductive material 106 may extend to active material 110 through a dielectric material 108, such as a silicon nitride material or a silicon oxide material. The conductive material 106 may also be in electrical contact with at least one of a conductive structure (not shown) and a semiconductive structure (not shown) in, on, or over a substrate (not shown). The active material 110 may be positioned on or over the conductive material 106, the ion source material 112 may be positioned on the active material 110, and electrode material 114 may be positioned on the ion source material 112.

The conductive material 106, which may be characterized as an inert electrode, may be an electrically conductive material including, but not limited to, a metal, a metal alloy, a conductive metal oxide, a conductive metal silicide, or a combination thereof. For example, the conductive material 106 may comprise tungsten (W), tungsten silicide ($WSi_n$), tungsten nitride (WN), nickel (Ni), nickel silicide ($NiSi_n$), cobalt silicide ($CoSi_n$), tantalum nitride (TaN), tantalum silicide ($TaSi_n$), platinum (Pt), gold (Au), titanium nitride (TiN), titanium silicide ($TiSi_n$), titanium silicon nitride (TiSiN), titanium aluminum nitride (TiAlN), molybdenum nitride (MoN), molybdenum silicide ($MoSi_n$), manganese silicide ($MnSi_n$), iridium (Ir), iridium oxide ($IrO_2$), ruthenium (Ru), ruthenium silicide ($RuSi_n$), ruthenium oxide ($RuO_2$), or a combination thereof, where "n" is a rational number. The conductive material 106 may be formed using conventional techniques, such as physical vapor deposition ("PVD"), chemical vapor deposition ("CVD"), or atomic layer deposition ("ALD"). PVD techniques include, but are not limited to, sputtering, evaporation, or ionized PVD. Such deposition techniques are known in the art and, therefore, are not described in detail herein.

The active material 110, which may also be characterized as a threshold switching material, may be a solid state electrolyte material formulated to be switched from one resistance state to another resistance state upon application of a physical signal (e.g., at least one of heat, voltage, current, or other physical phenomena) to the resistive memory element 102. For example, the active material 110 may be formulated to receive metal ions (e.g., copper ions, silver ions, zinc ions, etc.) from the ion source material 112 upon application of a potential (e.g., a positive potential) to the ion source material 112. The received metal ions may, for example, form at least one conductive filament or bridge within the active material 110 to lower a resistance state of the active material 110. In some embodiments, the conductive filament may be removed upon termination of the positive potential. In additional embodiments, the conductive filament may be removed by applying an opposite potential (e.g., a negative potential) to the ion source material 112. The potential (i.e., positive, or negative) applied to the ion source material 112 may thus be relative to a desired direction of metal ion movement within the resistive memory element 102 (e.g., into or out of the active material 110). Removing the conductive filament may return the active material 110 to a higher resistance state.

As a non-limiting example, the active material 110 may be formed of and include an oxide dielectric material, such as a metal oxide dielectric material. As used herein, the term "metal" means and includes a refractory metal, an alkali metal, an alkaline earth metal, a transition metal, a post-transition metal, or a metalloid. If, for example, the active material 110 is a metal oxide dielectric material, a metal component of the active material 110 may be at least one of hafnium (Hf), titanium (Ti), zirconium (Zr), vanadium (V), niobium (Nb), tantalum (Ta), chromium (Cr), molybdenum (Mo), tungsten (W), lanthanum (La), manganese (Mn), calcium (Ca), cobalt (Co), nickel (Ni), silicon (Si), germanium (Ge), and aluminum (Al). Non-limiting examples of a suitable metal oxide dielectric material include, but are not limited to, silicon dioxide ($SiO_2$), a hafnium oxide ($HfO_x$), a hafnium silicon oxide ($HfSi_yO_x$), a hafnium oxynitride ($HfO_xN_m$), a hafnium silicon oxynitride ($HfSi_yO_xN_m$), a zirconium oxide ($ZrO_x$), a zirconium silicon oxide ($ZrSi_yO_x$), a zirconium oxynitride ($ZrO_xN_m$), a zirconium silicon oxynitride ($ZrSi_yO_xN_m$), a titanium oxide ($TiO_x$), a titanium silicon oxide ($TiSi_yO_x$), a titanium oxynitride ($TiO_xN_m$), a titanium silicon oxynitride ($TiSi_yO_xN_m$), a tantalum oxide ($TaO_x$), a tantalum silicon oxide ($TaSi_yO_x$), a tantalum oxynitride ($TaO_xN_m$), a tantalum silicon oxynitride ($TaSi_yO_xN_m$), a niobium oxide ($NbO_x$), a niobium silicon oxide ($NbSi_yO_x$), a niobium oxynitride ($NbO_xN_m$), a niobium silicon oxynitride ($NbSi_yO_xN_m$), a vanadium oxide ($VO_x$), a vanadium silicon oxide ($VSi_yO_x$), a vanadium oxynitride ($VO_xN_m$), a vanadium silicon oxynitride ($VSi_yO_xN_m$), a tungsten oxide ($WO_x$), a tungsten silicon oxide ($WSi_yO_x$), a tungsten oxynitride ($WO_xN_m$), a tungsten silicon oxynitride ($WSi_yO_xN_m$), a molybdenum oxide ($MoO_x$), a molybdenum silicon oxide ($MoSi_yO_x$), a molybdenum oxynitride ($MoO_xN_m$), a molybdenum silicon oxynitride ($MoSi_yO_xN_m$), a chromium oxide ($CrO_x$), a chromium silicon oxide ($CrSi_yO_x$), a chromium oxynitride ($CrO_xN_m$), a chromium silicon oxynitride ($CrSi_yO_xN_m$), an aluminum oxide ($AlO_x$), or a combination thereof (e.g., a heterogeneous or homogenous material including of at least two of the foregoing metal oxide dielectric materials, a laminate including at least two of the foregoing metal oxide dielectric materials, etc.). In some embodiments, the active material 110 is $ZrO_x$. Formulae including at least one of "x," "y," and "m" above (e.g., $ZrO_x$, $ZrSi_yO_x$, $ZrO_xN_m$, $ZrSi_yO_xN_m$, etc.) represent a composition that on average contains x atoms of oxygen, y atoms of silicon, and m atoms of nitrogen for every one atom of the metal component. As the formulae are representative of relative atomic ratios and not strict chemical compositions, the active material 110 may be a stoichiometric compound or a non-stoichiometric compound, and values of x, y, and m may be integers or may be non-integers. As used herein, the term "non-stoichiometric compound" means and includes a chemical compound with an elemental composition that cannot be represented by a ratio of well-defined natural numbers and is in violation of the law of definite proportions.

As an additional non-limiting example, the active material 110 may be formed of and include a chalcogenide material. As used herein, the term "chalcogenide material" means and includes a material including at least one chalcogen and at least one more electropositive (i.e., less electronegative) element or radical. As used herein, the term "chalcogen" refers to an element of Group VI of the Periodic Table, such as oxygen (O), sulfur (S), selenium (Se), tellurium (Te), or polonium (Po). The electropositive element may be, for example, nitrogen (N), silicon (Si), nickel (Ni), gallium (Ga), germanium (Ge), arsenic (As), copper (Cu), silver (Ag), gold (Au), zinc (Zn), zirconium (Zr), indium (In), tin (Sn), antimony (Sb), lead (Pb), bismuth (Bi), or combinations thereof. The chalcogenide material may be a binary, ternary, or quaternary alloy of the at least one chalcogen and the at least one more electropositive element. Non-limiting examples of a suitable chalcogenide material include, but are not limited to, an As and Te compound, such as $As_2Te_3$; an As and Se compound, such as $As_2Se_3$; an As, Te, and Ge compound, such as $As_{30}Te_{45}Ge_{25}$; an As, Se, and Ge compound, such as $As_{28}Se_{42}Ge_{30}$; an As, S, Se, and Ge compound, such as $As_{30}S_{12}Se_{33}Ge_{25}$; an As, Te, Ge, Si, and In compound, such as $As_{37}Te_{39}Ge_9Si_{14}In$; a Cu and Te compound; a Cu and Se compound; a Cu, Te, and Ge compound; a Cu, Se, and Ge compound; a Cu, S, Se, and Ge compound, a Cu, Te, Ge, Si, and In compound; a Zr and Te compound; a Zr and Se compound; a Zr, Te, and Ge compound; a Zr, Se, and Ge compound; a Zr, S, Se, and Ge compound, a Zr, Te, Ge, Si, and In compound; or a combination thereof.

The active material 110 may have any suitable thickness. By way of non-limiting example, a thickness of the active material 110 may be within a range of from about 5 Angstroms (Å) to about 1000 Å, such as from about 5 Å to about 500 Å, or from about 5 Å to about 300 Å, or from about 5 Å to about 100 Å. In some embodiments, the thickness of the active material is about 30 Å. In addition, the active material 110 may be amorphous, semi-amorphous, or crystalline as formed or deposited. In some embodiments, the active material 110 is amorphous as formed. During use and operation of resistive memory element 102, the active material 110 may remain in its initial state. In other words, the active material 110 may not undergo a structural or phase change (e.g., a phase change from an amorphous state to a crystalline state, or a phase change from a crystalline state to an amorphous state) under normal operating conditions of the resistive memory element 102. The active material 110 may be formed on or over at least the conductive material 106 using conventional techniques, such as PVD, CVD, or ALD, which are not described in detail herein.

The ion source material 112, which may be characterized as an active electrode, may be an electrically conductive or electrically semiconductive material including at least one chalcogen, at least one active metal, and at least one additional element. The chalcogen may be at least one of S, Se, and Te. In some embodiments, the chalcogen is Te. The active metal may be a metal that can be ionized and moved into the active material 110 upon application of a physical signal (e.g., a voltage) to the ion source material 112. By way of non-limiting example, the active metal may be at least one of copper (Cu), silver (Ag), and zinc (Zn). In some embodiments, the active metal is Cu. The additional element may be an element that is compatible with each of the chalcogen and the active metal, and that reduces internal stress(es) (e.g., intrinsic strain) within the ion source material 112 as compared to conventional ion source materials lacking the additional element. As used herein, the term "compatible" means and includes a material that does not undesirably react with, break down, or absorb another material, and that also does not undesirably impair the chemical and/or mechanical properties of the another material. By way of non-limiting example, the additional element may be at least one of titanium (Ti), zirconium (Zr), aluminum (Al), boron (B), phosphorus (P), arsenic (As), beryllium (Be), dysprosium (Dy), gallium (Ga), gadolinium (Gd), germanium (Ge), and silicon (Si). In some embodiments, the additional element is Ge.

The ion source material 112 is formulated so as to facilitate, under the normal operating conditions of the resistive memory element 102, migration of metal ions into and out of the active material 110 while enabling the ion source material 112 to remain adhered to each of the active material 110 and the electrode material 114 and substantially limit and desirably prevent diffusion of the components of the ion source material 112 into the electrode material 114. The ion source material 112 may also be formulated to facilitate one or more additional properties or characteristics for the resistive memory element 102. In some embodiments, the ion source material 112 may be formulated to have an average coordination number within a range of from about 2.4 to about 2.7. Having an average coordination number within the range of from about 2.4 to about 2.7 may enable the ion source material 112 to be structurally stiff, due to a rigid network, or a closed matrix-type structure. The closed matrix-type structure may, for example, enable the resistive memory element 102 to have shorter programming cycles, to exhibit better resistivity switching characteristics, and to exhibit better data retention.

The ion source material 112 may include an amount of the active metal (e.g., Cu) within a range of from about 10 atomic percent to about 80 atomic percent. The additional element and the chalcogen may constitute a remaining amount of the ion source material 112. The types and relative ratios of the components of the ion source material 112 may be influenced by hybridization and ionicity of the components. If at least one of Ge, Ga, and Si is selected as the additional element, the at least one of Ge, Ga, and Si may be four-fold coordinated within the ion source material 112, and may be present at an amount within a range of from about 2 atomic percent to about 20 atomic percent, such as from about 5 atomic percent to about 12 atomic percent. If Al is selected as the additional element, Al may be three-fold coordinated within the ion source material 112 up to an amount about 23 atomic percent, may be two-fold coordinated at amounts of greater than about 23 atomic percent, and may be present at an amount within a range of from about 10 atomic percent to about 35 atomic percent, such as from about 10 atomic percent to about 25 atomic percent. If at least one of Zr and Ti is selected as the additional element, the at least one of Zr and Ti may facilitate a layered structure of the ion source material 112, and may be present at an amount within a range of from about 5 atomic percent to about 35 atomic percent, such as from about 10 atomic percent to about 25 atomic percent. If B is selected as the additional element, B may be present at an amount within a range of from about 2 atomic percent to about 10 atomic percent.

The inclusion of the additional element in the ion source material 112 may provide increased adhesion strength between the ion source material 112 and at least one of the active material 110 and the electrode material 114, reducing if not substantially eliminating delamination during subsequent processing and operation of the resistive memory element 102. For example, the additional element may enable the ion source material 112 to remain substantially adhered to the active material 110 and the electrode material 114 to a temperature of at least about 450° C. The increased interfacial adhesion strength may facilitate an increase in the amount of the active metal in the ion source material 112, which may benefit one or more electrical properties of the resistive memory element 102 (e.g., switching endurance, on/off resistance ratio, etc.). Parameters such as operating voltage and operating current may remain predictable during the operating life of the resistive memory element 102. The adhesion strength between the ion source material 112 and each of the active material 110 and the electrode material 114 may be measured as a function of the fracture energy sufficient to cause an adhesion failure between the ion source material 112 and each of the active material 110 and the electrode material 114. An adhesion strength value may be determined using a tape test or a four-point bend test, as known in the art. A high adhesion strength corresponds to a high fracture energy sufficient to cause the adhesion failure, or delamination of the ion source material 112 from the active material 110 or the electrode material 114. Furthermore, the inclusion of the additional element may provide increased surface smoothness and thickness uniformity for the ion source material 112 for a given ratio of the chalcogen to the active metal in the ion source material 112. Higher concentrations of the additional element may, for example, increase the surface smoothness of the ion source material 112.

The ion source material 112 may be homogeneous or may be heterogeneous. If heterogeneous, amounts of the additional element may vary in an organized manner throughout a thickness of the ion source material 112. As a non-limiting example, the additional element may vary stepwise or may vary continuously throughout the thickness of the ion source material. As used herein, the term "vary stepwise" means an amount of the additional element may change abruptly throughout the thickness of the ion source material 112. As used herein, the term "vary continuously" means an amount of the additional element may change progressively (e.g., linearly, parabolically, etc.) throughout the thickness of the ion source material 112. In some embodiments, an amount of the additional element at a location proximal the active material 110 may be greater than another amount of the additional element at a location proximal the electrode material 114. In additional embodiments, an amount of the additional element at one location in the ion source material 112 may be randomly greater than or less than another amount of the additional element at a different location in the ion source material 112. The heterogeneity of the ion source material 112 may be substantially undetectable by visual detection, but may be detectable by conventional spectroscopy or spectrometry techniques.

The ion source material 112 may have any suitable thickness. By way of non-limiting example, a thickness of the ion source material 112 may be within a range of from about 15 Angstroms (Å) to about 1000 Å, such as about from 15 Å to about 500 Å, or from about 15 Å to about 300 Å. In some embodiments the thickness of the ion source material 112 is about 300 Å. In addition, the ion source material 112 may be amorphous, semi-amorphous, or crystalline as formed. In some embodiments, the ion source material 112 is amorphous as formed. During use and operation, the ion source material 112 may remain in its initial state. In other words, the ion source material 112 may not undergo a structural or phase change (e.g., a phase change from an amorphous state to a crystalline state, or a phase change from a crystalline state to an amorphous state) under normal operating conditions of the resistive memory element 102. The phase stability of the ion source material 112 may facilitate predictable active metal ion extraction from the ion source material 112. In additional embodiments, a minor portion of the ion source material 112 may undergo a phase change under normal operating conditions of the resistive memory element 102, but a major portion of the ion source material 112 may remain in its initial phase.

Accordingly, a resistive memory element of the disclosure comprises a conductive material, an active material over the conductive material, and an ion source material on the active material and comprising at least one chalcogen, at least one active metal, and at least one additional element.

The ion source material 112 may be formed on the active material 110 using conventional techniques, such as PVD, CVD, or ALD. In some embodiments, the ion source material 112 is formed by PVD. By way of non-limiting example, at least one source of the at least one active metal (e.g., Cu, Ag, Zn, etc.), at least one source of the at least one chalcogen (e.g., S, Se, Te, etc.), and at least one source of the at least one additional element (e.g., Ti, Zr, Al, B, P, As, Be, Dy, Ga, Gd, Ge, Si, etc.), may be provided in a deposition chamber (not shown), such as a PVD chamber, configured to generate a plasma including a noble gas element (e.g., helium, neon, argon, krypton, xenon, or radon). Such sources are known in the art and, therefore, are not described in detail herein. Conditions, such as temperature and pressure, for generating and maintaining the plasma in the chamber may be conventional and, therefore, are not described in detail herein. As the different sources (i.e., the source of the active metal, the source of the chalcogen, and the source of the additional element) are bombarded with the plasma, atoms are sputtered from the different sources and form on a surface of the active material 110. In additional embodiments, at least one composite source including two or more of the components of the ion source material 112 (e.g., two or more of the active metal, the chalcogen, and the additional element) may be used in place of or in addition to at least one of the different sources described above. A desired thickness of the ion source material 112 may be achieved by controlling a deposition time and an amount of power used. Suitable PVD chambers are known in the art and, therefore, are not described in detail herein.

Accordingly, a method of forming a resistive memory element comprises forming an active material on a conductive material. An ion source material comprising at least one chalcogen, at least one active metal, and at least one additional element selected from the group consisting of Ti, Zr, Al, B, P, As, Be, Dy, Ga, Gd, Ge, and Si is formed on the active material.

Following the formation of the ion source material 112 on the active material 110, the ion source material 112 may be thermally annealed (e.g., heated). For example, the ion source material 112 may be exposed to a temperature less than the glass transition temperature of the ion source material 112, such as a temperature slightly below the glass transition temperature of the ion source material 112. The presence of the additional element in the ion source material 112 may increase the glass transition temperature of the ion source material 112. In some embodiments, the ion source material 112 may, for example, be annealed at a temperature within a range of from about 100° C. to about 450° C. for a period of time within a range of from about 30 seconds to about 60 minutes. The thermal anneal may be performed before or after the formation of the electrode material 114. The thermal anneal may increase the rigidity of the ion source material 112. The thermal anneal may also enable at least some components of the ion source material 112 to react with at least some components of one or more of the active material 110 and the electrode material 114 to facilitate stronger adhesion to at least one of the active material 110 and the electrode material 114. In some embodiments, a portion of the at least one additional element of the ion source material 112 may migrate toward the active material 110 during the thermal anneal to react with at least one component of the active material 110 at an interface of the ion source material 112 and the active material 110.

The electrode material 114 may include any suitable conductive material including, but not limited to, a metal, a metal alloy, a metal silicide, a conductive metal oxide, or combinations thereof. By way of non-limiting example, the electrode material 114 may be formed of W, WN, $WSi_n$, Ni, $NiSi_n$, $CoSi_n$, TaN, $TaSi_n$, Pt, Au, TiN, $TiSi_n$, TiSiN, TiAlN, MoN, $MoSi_n$, $MnSi_n$, $NiSi_n$, Ir, $IrO_2$, Ru, $RuSi_n$, $RuO_2$, or a combination thereof, where "n" is a rational number. The electrode material 114 may be the same as or may be different than the conductive material 106. In at least some embodiments, the electrode material 114 is W. In additional embodiments, the electrode material 114 is $WSi_n$. The electrode material 114 may have any suitable thickness, such as within a range of from about 10 Å to about 1000 Å. In some embodiments, the thickness of the electrode material 114 is about 300 Å. The electrode material 114 may be formed on the ion source material 112 using conventional techniques, such as PVD, CVD, or ALD, which are not described in detail herein.

While FIG. 1 depicts discrete boundaries between each of the active material 110, the ion source material 112, and the electrode material 114, in some embodiments the boundaries between the materials may not be discrete. In other words, at least one component of one or more of the active material 110, the ion source material 112, and the electrode material 114 may be partially diffused into another of the active material 110, the ion source material 112, and the electrode material 114 at an interface of the materials. Accordingly, one or more interfaces between the active material 110, the ion source material 112, and the electrode material 114 may include a gradual change (i.e., gradient) in an amount of at least one component, as opposed to a discrete, step-like change.

Figure 2:
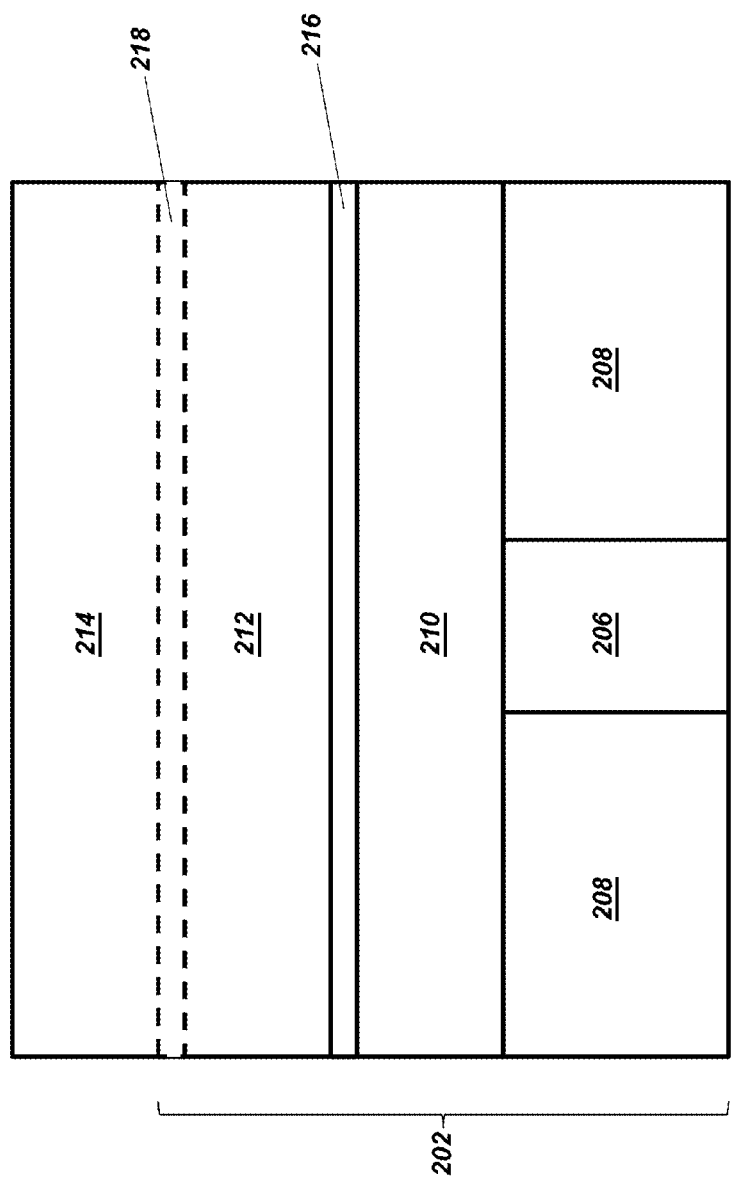
FIG. 2 is a cross-sectional view of a resistive memory element, in accordance with another embodiment of the disclosure.

Another embodiment of the disclosure will now be described with reference to FIG. 2, which illustrates a resistive memory element 202, such as a conductive bridge random access memory element, coupled to an electrode material 214. The resistive memory element 202 may include a conductive material 206, an active material 210, an interfacial material 216, an ion source material 212, and, optionally, another interfacial material 218. As depicted in FIG. 2, the conductive material 206 may extend to active material 210 through a dielectric material 208. The conductive material 206 may be in electrical contact with at least one of a conductive structure (not shown) and a semiconductive structure (not shown) in, on, or over a substrate (not shown). The active material 210 may be positioned on the conductive material 206. The interfacial material 216 may be positioned on the active material 210, and the ion source material 212 may be positioned on the interfacial material 216. The another interfacial material 218, if present, may be positioned on the ion source material 212. The electrode material 214 may be on the another interfacial material 218, if present, or may be on the ion source material 212. Each of the conductive material 206, the dielectric material 208, the active material 210, and the electrode material 214 may be substantially similar to and may be formed in a substantially similar manner as the conductive material 106, the dielectric material 108, the active material 110, and the electrode material 114 described above in relation to FIG. 1, respectively.

The interfacial material 216 may be formed of and include at least one element selected from the group consisting of Ti, Zr, Al, B, P, As, Be, Dy, Ga, Gd, Ge, and Si. In some embodiments, the interfacial material 216 may be a chalcogenide including the at least one additional element. A thickness of the interfacial material 216 may be selected based on material characteristics of at least one other component of the resistive memory element 202 (e.g., material characteristics of one or more of the active material 210 and the ion source material 212). By way of non-limiting example, the thickness of the interfacial material 216 may be within a range of from about 5 Å to about 20 Å. The interfacial material 216 may be formed using conventional techniques, such as PVD, CVD, or ALD, which are not described in detail herein.

The ion source material 212 may be substantially similar to the ion source material 112 described above in relation to FIG. 1 except that the ion source material 212 may include a reduced concentration of the at least one additional element (e.g., Ti, Zr, Al, B, P, As, Be, Dy, Ga, Gd, Ge, Si, etc.), and an increased concentration of one or more of the at least one chalcogen (e.g., S, Se, Te, etc.) and the at least one active metal (e.g., Cu, Ag, Zn, etc.). In some embodiments, the additional element may be omitted from the ion source material 212. In additional embodiments, the concentration of the additional element in the ion source material 212 may be substantially similar to that described above in relation to the ion source material 112. The interfacial material 216 may provide increased adhesion strength between the active material 210 and the ion source material 212 relative to forming the ion source material 212 directly on the active material 210, reducing a risk of delamination. The ion source material 212 may be formed using conventional techniques, such as PVD, CVD, or ALD.

Accordingly, a resistive memory element of the disclosure comprises a conductive material, an active material over the conductive material, an ion source material over the active material and comprising at least one chalcogen and at least one active metal, and an interfacial material between the active material and the ion source material and formulated to keep the active material and the ion source material adhered to each other up to a temperature of at least about 450° C.

The another interfacial material 218, if present, may include at least one element selected from the group consisting of Ti, Zr, Al, B, P, As, Be, Dy, Ga, Gd, Ge, and Si. The another interfacial material 218 may be the same as or may be different than the interfacial material 216. A thickness of the another interfacial material 218 may be selected based on material characteristics of at least one other component of the resistive memory element 202 (e.g., material characteristics of one or more of the ion source material 212 and the electrode material 214). By way of non-limiting example, the thickness of the another interfacial material 218 may be within a range of from about 5 Å to about 20 Å. The another interfacial material 218 may provide increased adhesion strength between the ion source material 212 and the electrode material 214 relative to forming the electrode material 214 directly on the ion source material 212, thereby reducing a risk of delamination. The another interfacial material 218 may be formed using conventional techniques, such as PVD, CVD, or ALD, which are not described in detail herein.

Figure 3:
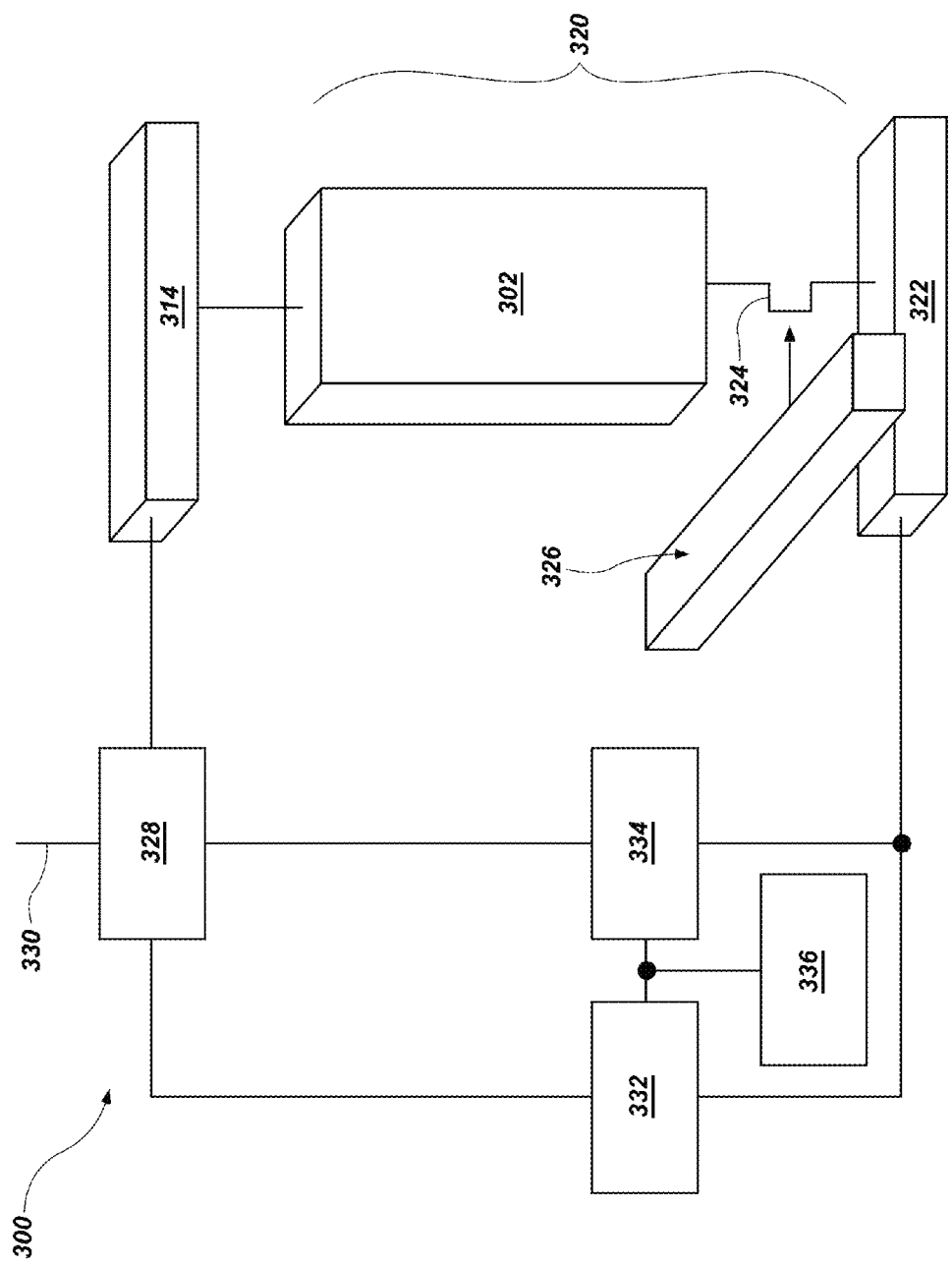
FIG. 3 is a functional block diagram of a resistive memory device, in accordance with embodiments of the disclosure.

FIG. 3 illustrates a functional block diagram of a resistive memory device 300 in accordance with an embodiment of the disclosure. The resistive memory device 300 may include at least one resistive memory cell 320 between at least one data/sense line, for example a bit line 314, and at least one source line 322. The bit line 314 may be substantially similar to the electrode material 114, 214 previously described. The resistive memory cell 320 may include an access device 324 coupled or connected in series with a resistive memory element 302. The resistive memory element 302 may be one of the resistive memory elements 102, 202 previously described. The access device 324 may function as a switch for enabling and disabling current flow through the resistive memory element 302. By way of non-limiting example, the access device 324 may be a transistor (e.g., a field-effect transistor, a bipolar junction transistor, etc.) with a gate (not shown) connected to an access line, for example, a word line 326. The word line 326 may extend in a direction substantially perpendicular to that of the bit line 314. The bit line 314 and the source line 322 may be connected to logic for programming and reading the resistive memory element 302. A control multiplexer 328 may have an output connected to the bit line 314. The control multiplexer 328 may be controlled by a control logic line 330 to select between a first input connected to a pulse generator 332, and a second input connection to read-sensing logic 334.

Accordingly, a resistive memory cell of the disclosure comprises an access device, and a resistive memory element coupled to the access device. The resistive memory element comprises a conductive material, an active material over the conductive material, and an ion source material having an average coordination number within a range of from about 2.4 to about 2.7 over the active material and comprising at least one chalcogen, at least one active metal, and at least one additional element.

Furthermore, a resistive memory device of the disclosure comprises a word line, a bit line, a source line, and a resistive memory cell between the bit line and the source line. The resistive memory cell comprises an access device coupled to the word line, and a resistive memory element between the access device and the bit line. The resistive memory element comprises a conductive material, an active material over the conductive material, and an ion source material over the active material, comprising at least one chalcogen, at least one active metal, and at least one additional element, and formulated to remain adhered to each of the active material and the bit line up to a temperature of about 450° C.

During a programming operation, a voltage greater than a threshold voltage of the access device 324 may be applied to the word line 326 to turn on the access device 324. Turning on the access device 324 completes a circuit between the source line 322 and the bit line 314 by way of the resistive memory element 302. After turning on the access device 324, a bias generator 336 may establish, by way of the pulse generator 332, a bias voltage potential difference between the bit line 314 and the source line 322. Collectively referring to FIGS. 1 through 3, if a foiining bias voltage or a set bias voltage is established, metal ions migrate from the ion source material 112, 212 into the active material 110, 210 to form conductive filaments in the active material 110, 210. The conductive filaments reduce the resistivity of the resistive memory element 302. Conversely, if a reset bias voltage is established, metal ions migrate from the active material 110, 210 back into the ion source material 112, 212 to remove the conductive filaments therein and increase the resistivity of the resistive memory element 302.

During a read operation, the bias generator 336 may establish, by way of read-sensing logic 334, a read bias voltage potential difference between the bit line 314 and the source line 322. The read bias voltage may be lower than the reset bias voltage. The read bias voltage enables current to flow through the resistive memory element 302 according to a resistance state of the active material 110, 210 (FIGS. 1 and 2). For example, for a given read bias voltage, if the active material 110, 210 is in a high-resistance state (e.g., a reset state), a relatively smaller current flows through the resistive memory element 302 than if the active material 110, 210 is in a low-resistance state (e.g., a set state). The amount of current flowing through resistive memory element 302 during the read operation may be compared to a reference input by the read-sensing logic 334 (e.g., a sense amplifier) to discriminate whether the data stored in the resistive memory cell 320 is a logic "1" or a logic "0."

The resistive memory elements 102, 202 of the disclosure may exhibit improved structural and electrical characteristics as compared to conventional resistive memory elements. For example, relative to conventional resistive memory elements, the ion source materials 112, 212 of the resistive memory elements 102, 202 of the disclosure may exhibit one or more of reduced internal stress(es), increased interfacial adhesion strength, increased material thickness uniformity, increased thermal budget, and higher active metal concentration. Such characteristics may enable at least one of improved manufacturability, performance, and durability of the resistive memory elements 102, 202, and of resistive memory cells 320 and resistive memory devices 300 including the resistive memory elements 102, 202.

The following examples serve to explain embodiments of the present disclosure in more detail. The examples are not to be construed as being exhaustive or exclusive as to the scope of the disclosure.

EXAMPLES

Example 1

Adhesion Strength of a $ZrO_x$/CuGeTe/W Stack

Figure 4A:
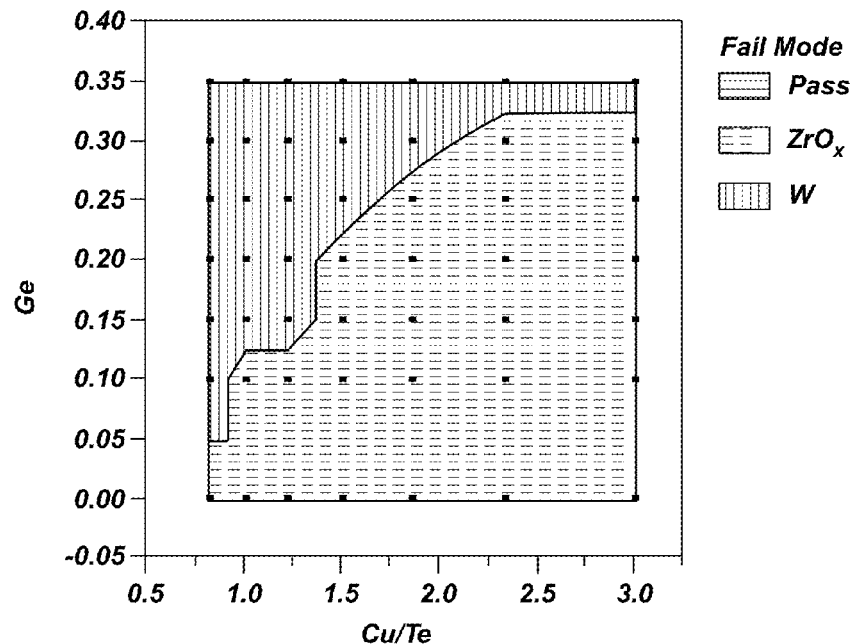
FIGS. 4A through 7B are contour plots depicting the interfacial adhesion strength of a variety of resistive memory elements, as described below in Examples 1 through 4.
Figure 4B:
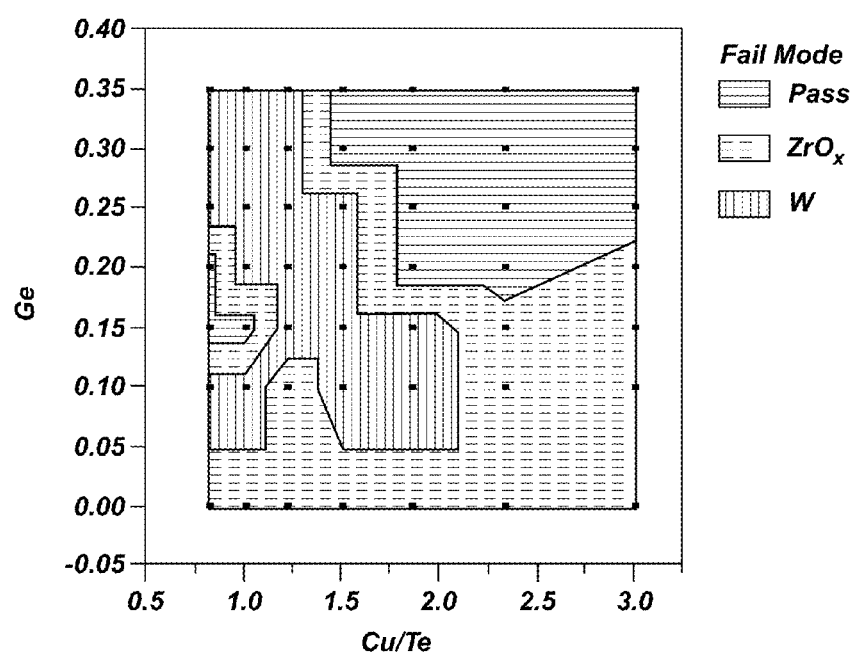

Samples comprising material stacks including an active material of zirconium oxide over a silicon nitride substrate, an ion source material including copper, tellurium, and germanium on the active material, and an electrode material of tungsten on the ion source material were formed and subjected to adhesion strength analysis. The active material had a thickness of about 30 Å, and each of the ion source material and the electrode material had a thickness of about 300 Å. Tape tests were performed on formed samples having different ion source material formulations in the absence of a post-formation anneal and following a post-formation anneal at 425° C. for 20 minutes. The tape tests included scribing a "#" into the center of each of the samples, pressing a strip of tape (i.e., a clean room compatible contamination sticker attached to a front opening universal pod) onto each of the samples, quickly peeling the tape off, and observing any adhesion failures at the interfaces of the active material, the ion source material, and the electrode material. FIG. 4A is a contour plot depicting the results of the tape tests for the samples not subjected to a post-formation anneal. FIG. 4B is a contour plot depicting the results of the tape tests for the samples subjected to the post-formation anneal. In each of FIGS. 4A and 4B, the y-axis depicts the amount of germanium (in terms of atomic percentage/100) in the ion source material. The x-axis depicts the ratio of copper to tellurium in the ion source material. The results indicate the inclusion of germanium in the ion source material improved adhesion strength depending on the interface (i.e., the $ZrO_x$/CuGeTe interface, or the CuGeTe/W interface), and the copper to tellurium ratio of the ion source material. Performing a post-formation annealing appeared to improve the adhesion strength of ion source materials having higher germanium and copper concentrations and lower tellurium concentrations.

Example 2

Adhesion Strength of a $ZrO_x$/CuSiTe/$WSi_n$ Stack

Figure 5:
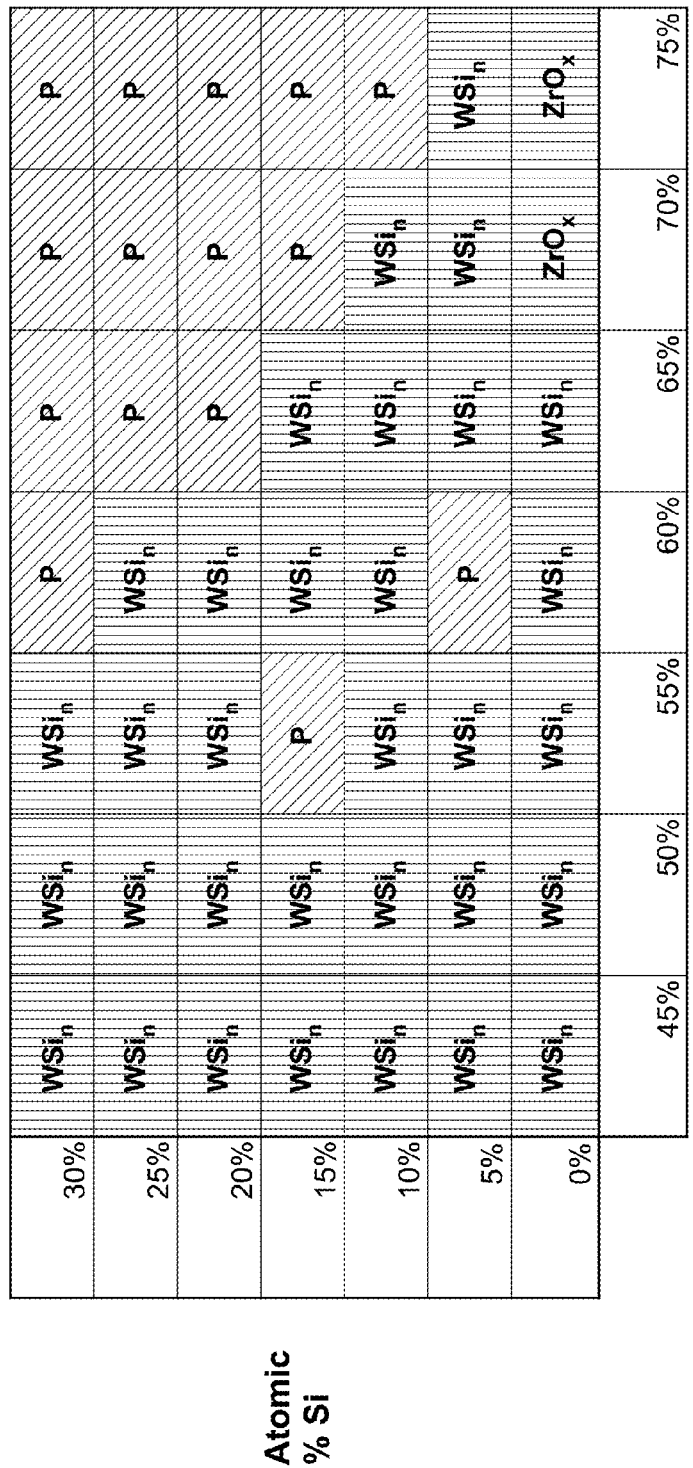

Samples comprising material stacks including an active material of zirconium oxide over a silicon nitride substrate, an ion source material including varying concentrations of copper, tellurium, and silicon on the active material, and an electrode material of tungsten silicide on the ion source material were formed and subjected to adhesion strength analysis following an anneal at 425° C. for 20 minutes. The active material had a thickness of about 30 Å, and each of the ion source material and the electrode material had a thickness of about 300 Å. The adhesion strength analysis was conducted according to the tape test described in Example 1. FIG. 5 is a contour plot depicting the results of the tape tests. In FIG. 5, the label "$WSi_n$" represents an observed adhesion failure at the interface of the ion source material and the electrode material, the label "$ZrO_x$" represents an observed adhesion failure at the interface of the ion source material and the active material, and the label "P" represents no observed adhesion failure. The y-axis depicts the amount of silicon (in terms of atomic percentage) in the ion source material. The x-axis corresponds to the amount copper (in terms of a percentage) in the combined amount of copper and tellurium in the ion source material. The results indicate that the inclusion of silicon in the ion source material improved adhesion strength depending on the interface and the copper to tellurium ratio of the ion source material. Higher concentrations of silicon appeared to increase adhesion strength for ion source materials having higher concentrations of copper and lower concentrations of tellurium. Similar results were observed for ion source materials including germanium instead of silicon.

Example 3

Adhesion Strength of a $ZrO_x$/Ge/CuTe/W Stack

Figure 6A:
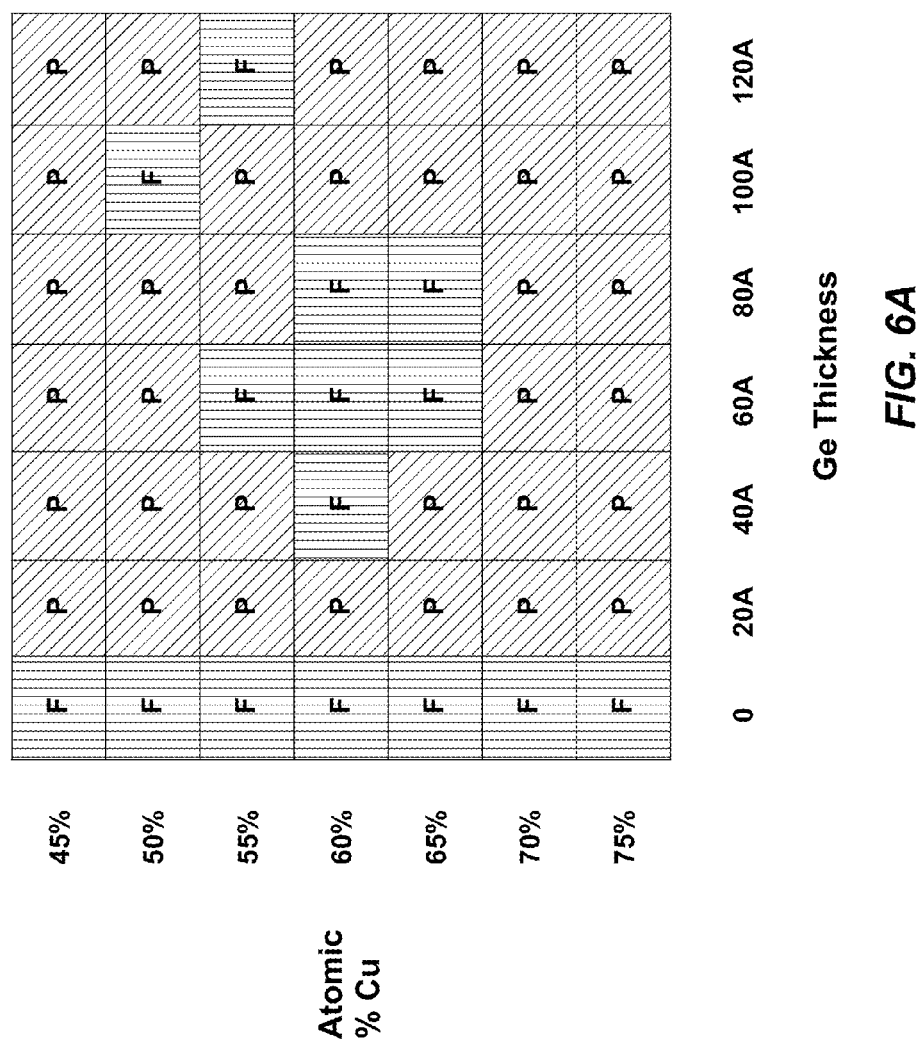
Figure 6B:
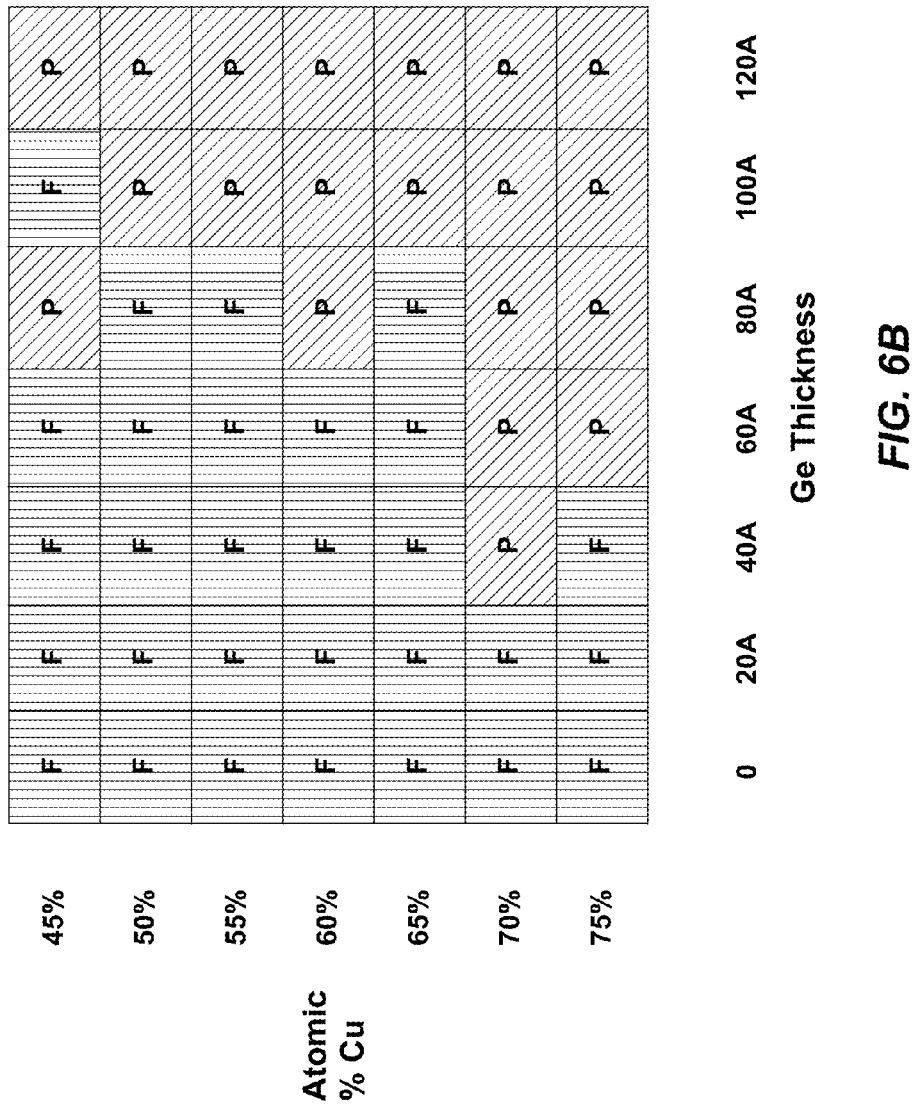

Samples comprising material stacks including an active material of zirconium oxide over a silicon nitride substrate, an interfacial material of germanium on the active material, an ion source material including copper and tellurium on the interfacial material, and an electrode material of tungsten on the ion source material were formed and subjected to adhesion strength analysis. The active material had a thickness of about 30 Å, the interfacial material had varying thicknesses within a range of from about 0 Å to about 120 Å, and each of the ion source material and the electrode material had a thickness of about 300 Å. Tape tests were performed as described above in Example 1. FIG. 6A is a contour plot depicting the results of the tape tests for the samples not subjected to a post-formation anneal. FIG. 6B is a contour plot depicting the results of the tape tests for the samples subjected to the post-formation anneal. In each of FIGS. 6A and 6B, the label "F" represents an observed adhesion failure either at the interface of the ion source material and the electrode material or at the interface of the ion source material and the active material, and the label "P" represents no observed adhesion failure. In addition, in each of FIGS. 6A and 6B, the y-axis depicts the amount of copper (in terms of atomic percentage) in the ion source material, and the x-axis depicts the thickness of the interfacial material of germanium. The results indicate that, for a variety of interfacial material thicknesses (e.g., thicknesses greater than or equal to about 20 Å), the inclusion of an interfacial material of germanium increased adhesion between the ion source material and the active material with or without a post-formation anneal.

Example 4

Adhesion Strength of a $ZrO_x$/CuTe/Ge/W Stack

Figure 7A:
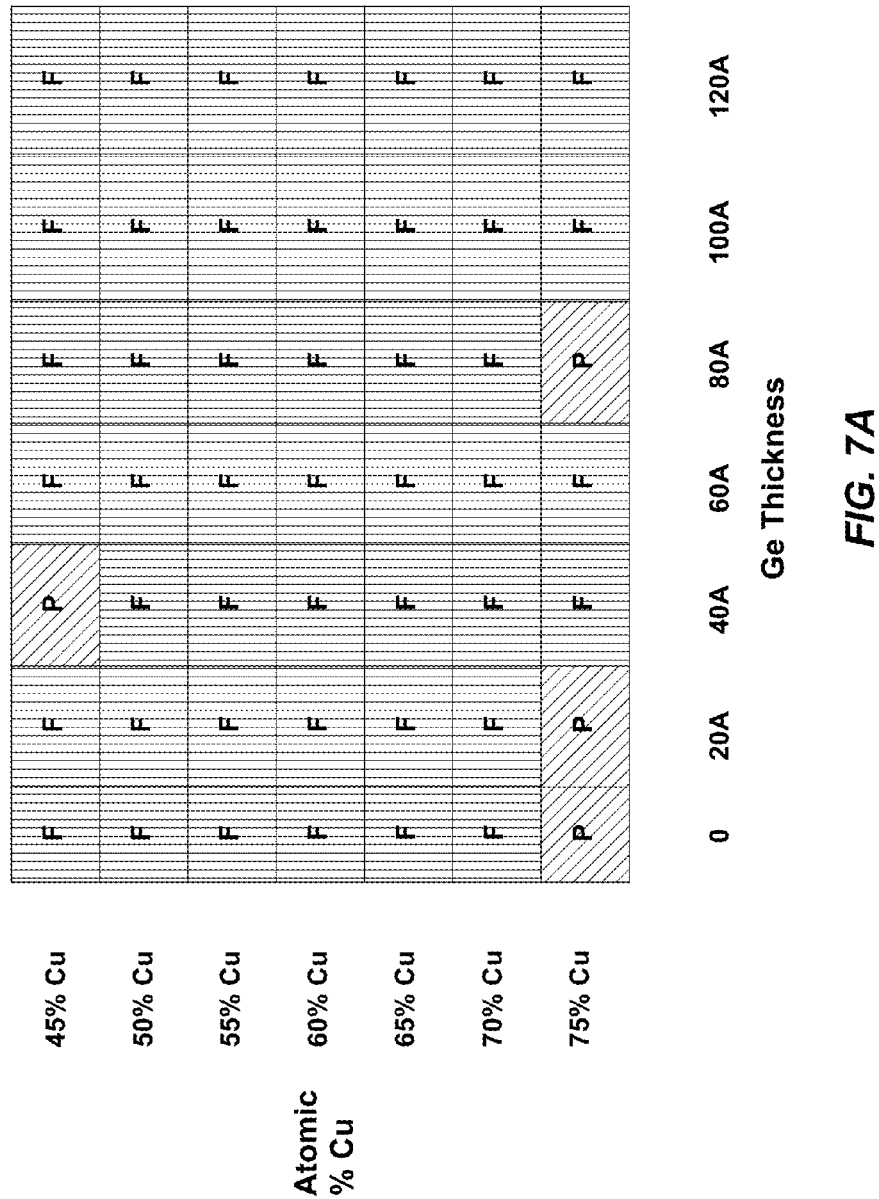
Figure 7B:
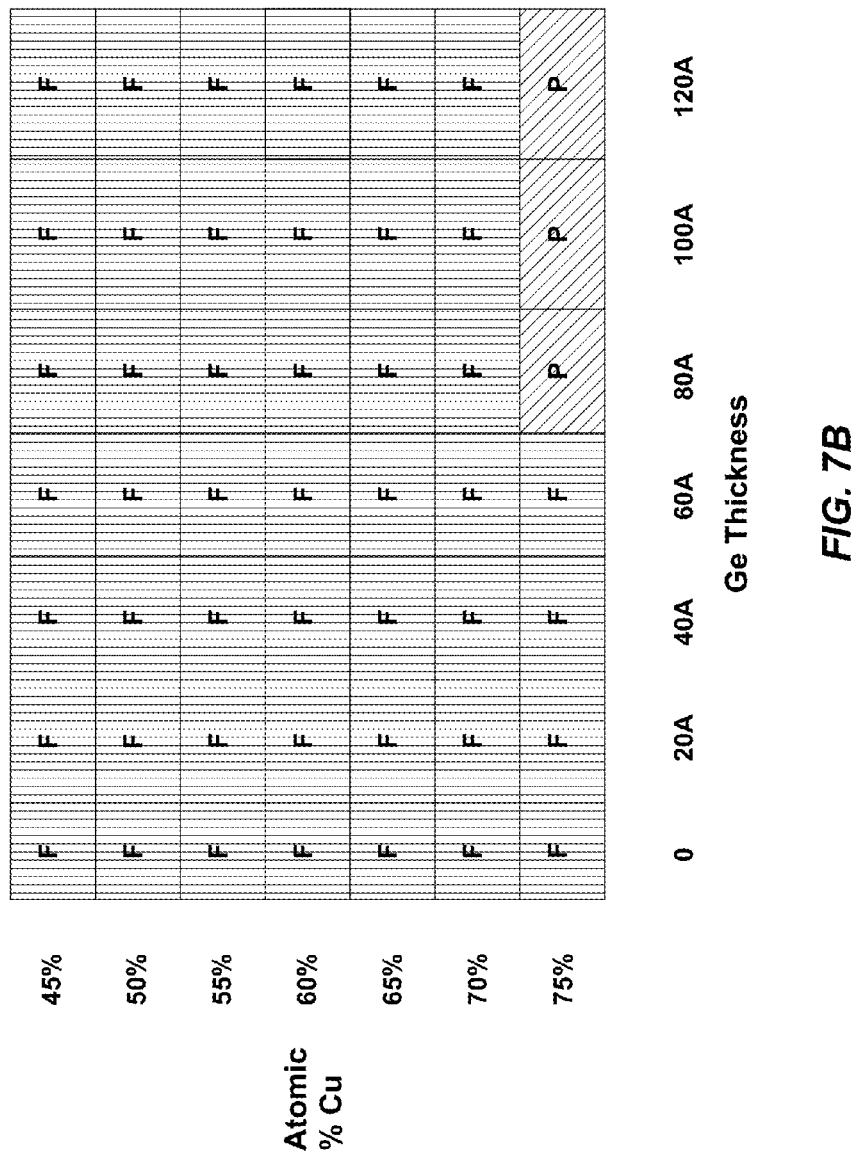

Samples comprising material stacks including an active material of zirconium oxide over a silicon nitride substrate, an ion source material including copper and tellurium on the active material, an interfacial material of germanium on the ion source material, and an electrode material of tungsten on the interfacial material were formed and subjected to adhesion strength analysis. The active material had a thickness of about 30 Å, the interfacial material had varying thicknesses within a range of from about 0 Å to about 120 Å, and each of the ion source material and the electrode material had a thickness of about 300 Å. Tape tests were performed as described above in Example 1. FIG. 7A is a contour plot depicting the results of the tape tests for the samples not subjected to a post-formation anneal. FIG. 7B is a contour plot depicting the results of the tape tests for the samples subjected to the post-formation anneal. In each of FIGS. 7A and 7B, the label "F" represents an observed adhesion failure either at the interface of the ion source material and the electrode material or at the interface of the ion source material and the active material, and the label "P" represents no observed adhesion failure. In addition, in each of FIGS. 7A and 7B, the y-axis depicts the concentration of copper (in terms of atomic percentage) in the ion source material, and the x-axis depicts the thickness of the interfacial material of germanium. The results indicate that, at least where a post-formation anneal has been performed, the inclusion of the interfacial material between the ion source material and the electrode material resulted in increased adhesion at least partially depending on copper concentration in the ion source material and the thickness of the interfacial material.

Example 5

Comparative Analysis of Adhesion Strength

Figure 8:
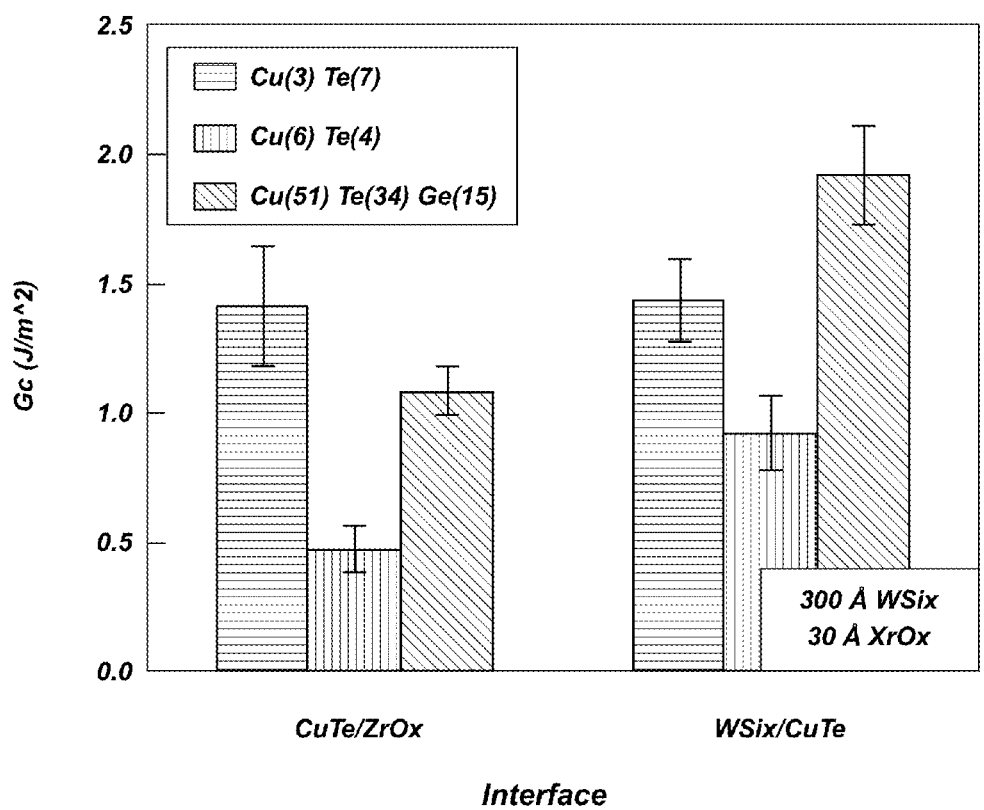
FIG. 8 is a bar graph comparing the interfacial adhesion strength of a variety of resistive memory elements, as described below in Example 5.
Figure 9A:
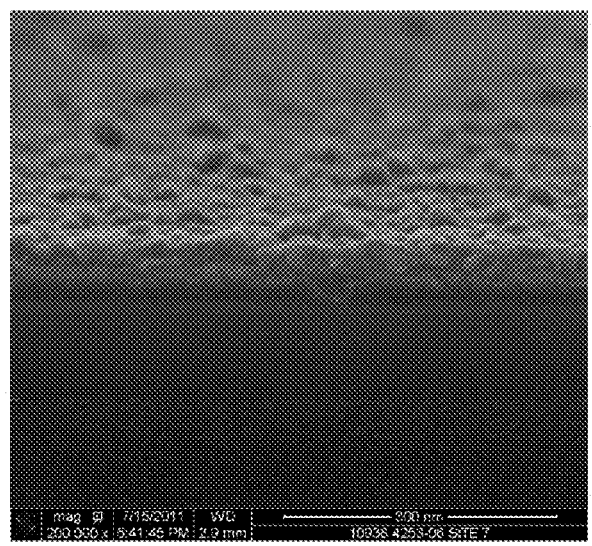
FIGS. 9A through 9D are scanning electron micrographs (SEMs) each showing a perspective view of ion source material of a resistive memory element, as described below in Example 6.
Figure 9B:
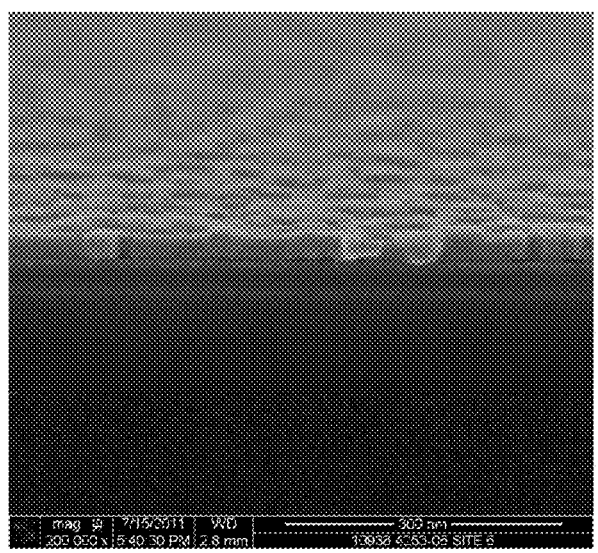
Figure 9C:
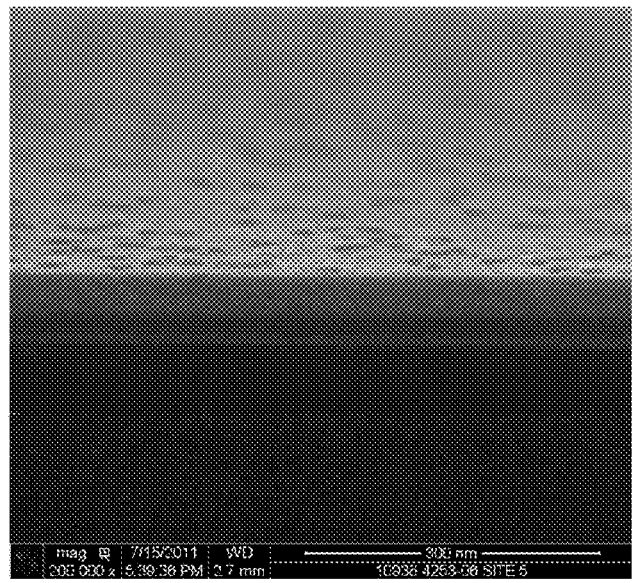
Figure 9D:
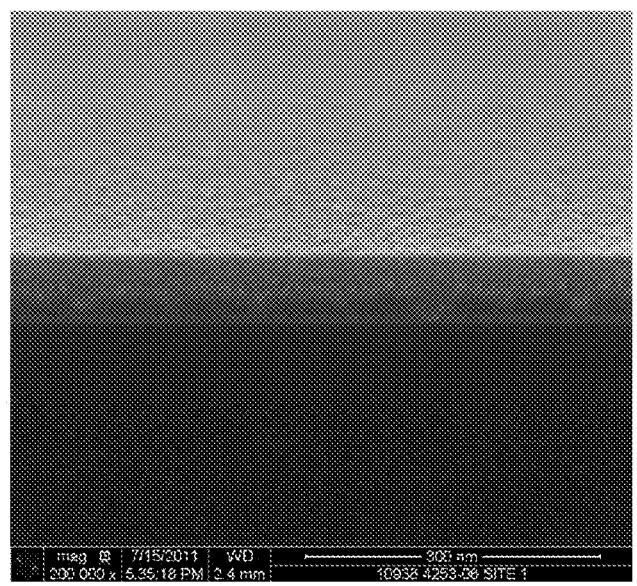

Samples comprising material stacks each including an active material of zirconium oxide over a silicon nitride substrate, an ion source material on the active material, and an electrode material of tungsten silicide on the ion source material were compared in terms of adhesion strength at the interface of the active material and the ion source material and at the interface of the ion source material and the electrode material. The active material had a thickness of about 30 Å, and each of the ion source material and the electrode material had a thickness of about 300 Å. The ion source material of a first sample stack included a 3:7 ratio of copper to tellurium and no germanium. The ion source material of a second sample stack included a 6:4 ratio of copper to tellurium and no germanium. The ion source material of a third sample stack included about 51 atomic percent copper, about 34 atomic percent tellurium, and about 15 atomic percent germanium. FIG. 8 is a bar graph depicting the adhesion strength at the interfaces (i.e., the interface of the active material and the ion source material, and the interface of the ion source material and the electrode material) for the different sample stacks. The adhesion strength was determined using a conventional four-point bend (FPB) methodology. As shown in FIG. 8, the inclusion of germanium can advantageously facilitate increased interfacial adhesion for ion source materials having higher copper concentrations.

Example 6

Comparative Smoothness Analysis

Sample ion source materials including different concentrations of copper, tellurium, and silicon were formed on active materials of zirconium oxide and subjected to smoothness analysis. A first sample included a 3:1 ratio of copper to tellurium and no silicon. A second sample included an 11:9 ratio of copper to tellurium and no silicon. A third sample included about 10 atomic percent silicon and a 3:1 ratio of copper to tellurium. A fourth sample included about 30 atomic percent silicon and an 11:9 ratio of copper to tellurium. FIGS. 9A through 9D are scanning electron micrographs (SEMs) showing a perspective view of the first sample, the second sample, the third sample, and the fourth sample, respectively. As shown by the progression of FIGS. 9A through 9D, increasing the concentration of silicon in the ion source material increased the smoothness and thickness uniformity of the ion source material.

Example 7

Morphology Analysis

Figure 10A:
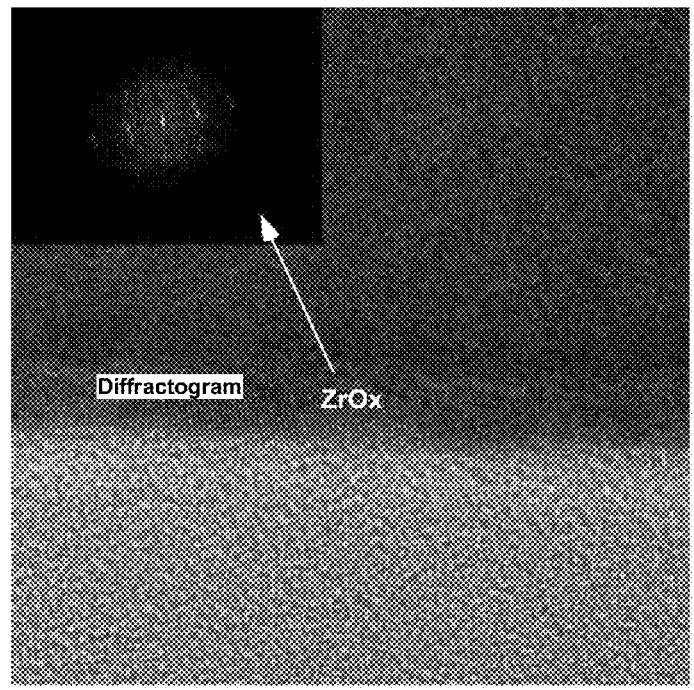
FIGS. 10A and 10B are transmission electron micrographs (TEMs) showing a partial cross-sectional view of a portion of a resistive memory element as-deposited and following a post-formation anneal, respectively, as described below in Example 7.
Figure 10B:
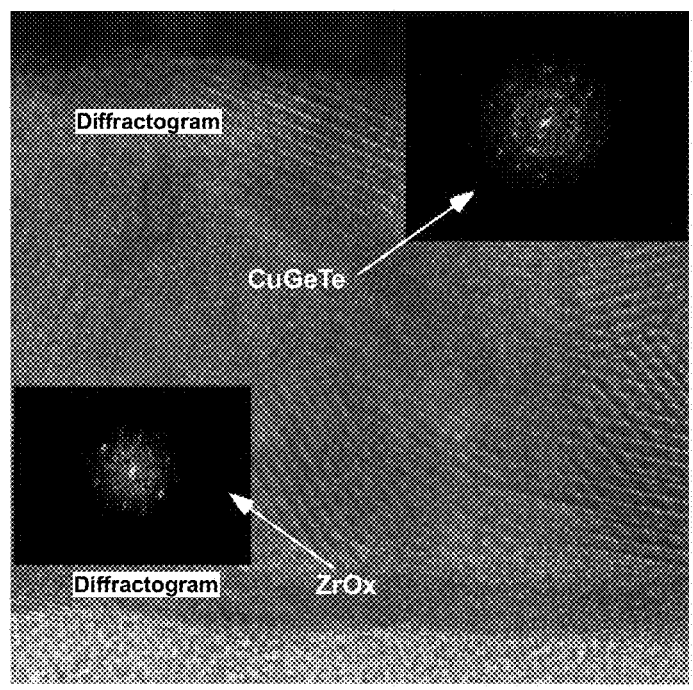

A sample stack including an active material of zirconium oxide over a silicon nitride substrate, an ion source material including copper (about 60 atomic percent), tellurium (about 20 atomic percent), and germanium (about 20 atomic percent) on the active material, and an electrode material of tungsten on the ion source material was formed. The ion source material was then subjected to morphology analysis both as-deposited and following a post-formation anneal at 425° C. for 20 minutes. FIG. 10A is a transmission electron micrograph (TEM) showing the morphology of the as-deposited ion source material. As depicted in FIG. 10A, the ion source material was smooth and amorphous as-deposited. FIG. 10B is a TEM showing the morphology of the ion source material following the anneal. As depicted in FIG. 10B, the post-formation anneal resulted in some crystallization of the ion source material, but the ion source material remained relatively smooth and adhered to the active material and the electrode material.

Example 8

Compositional Analysis

Figure 11A:
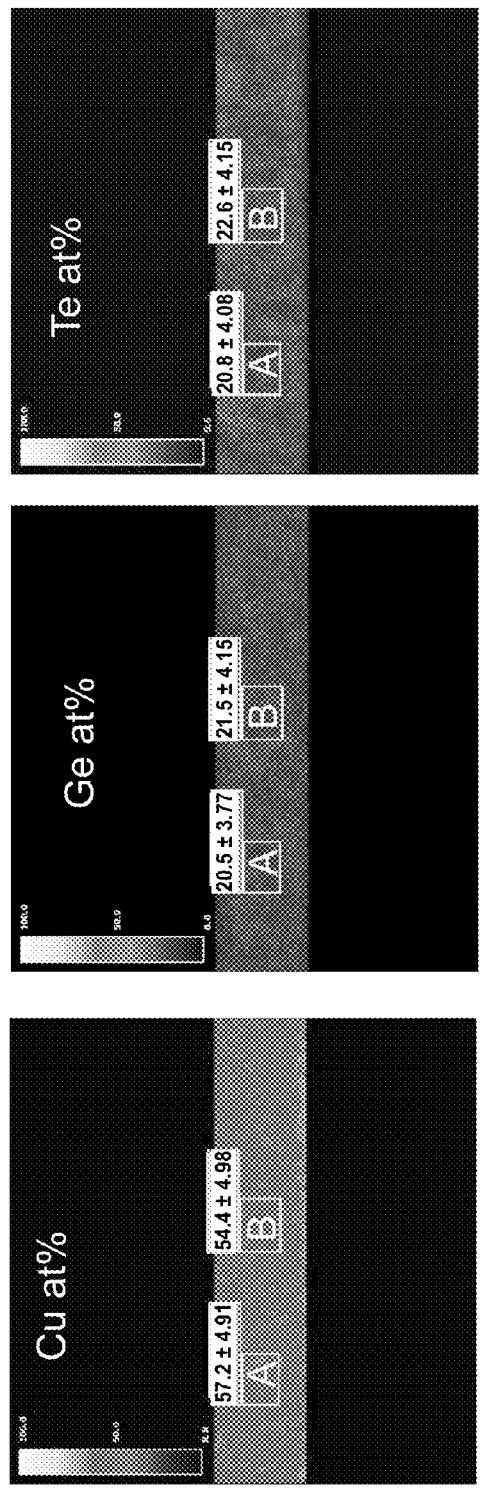
FIGS. 11A and 11B are energy-dispersive x-ray spectroscopy (EDS) maps showing the concentration profile of multiple components of an ion source material of a resistive memory element as-deposited and following a post-formation anneal, respectively, as described below in Example 8.
Figure 11B:
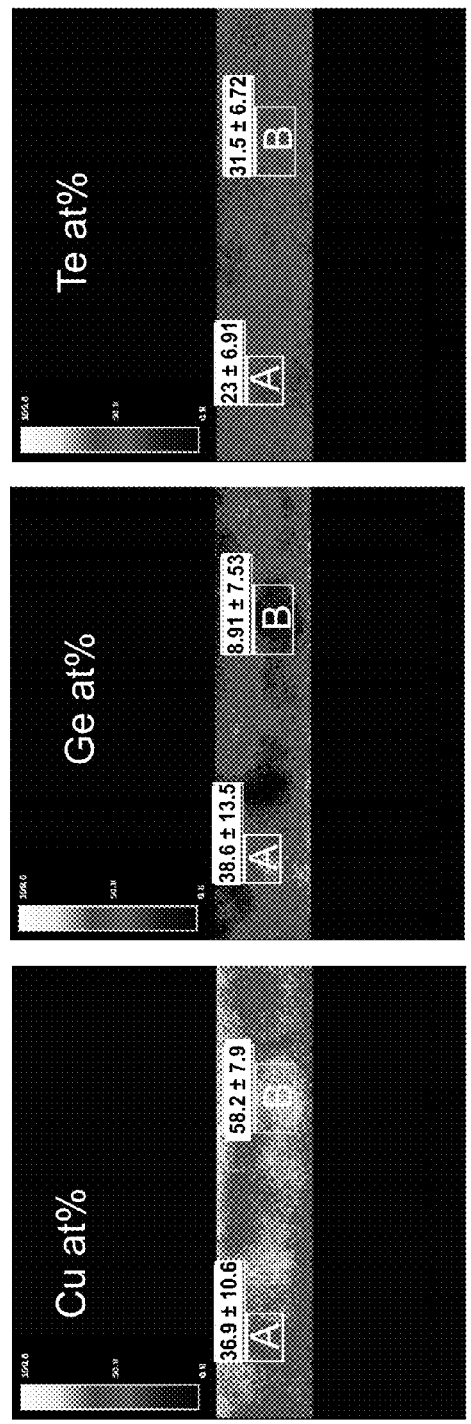

A sample stack including an active material of zirconium oxide over a silicon nitride substrate, an ion source material including copper (about 60 atomic percent), tellurium (about 20 atomic percent), and germanium (about 20 atomic percent) on the active material, and an electrode material of tungsten on the ion source material was formed. The ion source material was then subjected to energy-dispersive x-ray spectroscopy (EDS) mapping analysis both as-deposited and following a post-formation anneal at 425° C. for 20 minutes. As in Example 7, some crystallization of the ion source material was observed following the post-formation anneal. FIG. 11A depicts the EDS element maps for copper, germanium, and tellurium for the as-deposited ion source material. FIG. 11A shows that the ion source material was substantially homogenous and smooth as-deposited. FIG. 11B depicts the EDS element maps for copper, germanium, and tellurium for the ion source material following the post-formation anneal. FIG. 11B shows that the anneal resulted in movement or segregation of germanium toward the interface of the ion source material and the active material, and movement of copper toward the electrode material. FIG. 11B supports that the inclusion of germanium in the ion source material facilitates increased adhesion strength at interfaces with the ion source material, even though some crystallization was observed.

Example 9

Switching Endurance Testing

Figure 12:
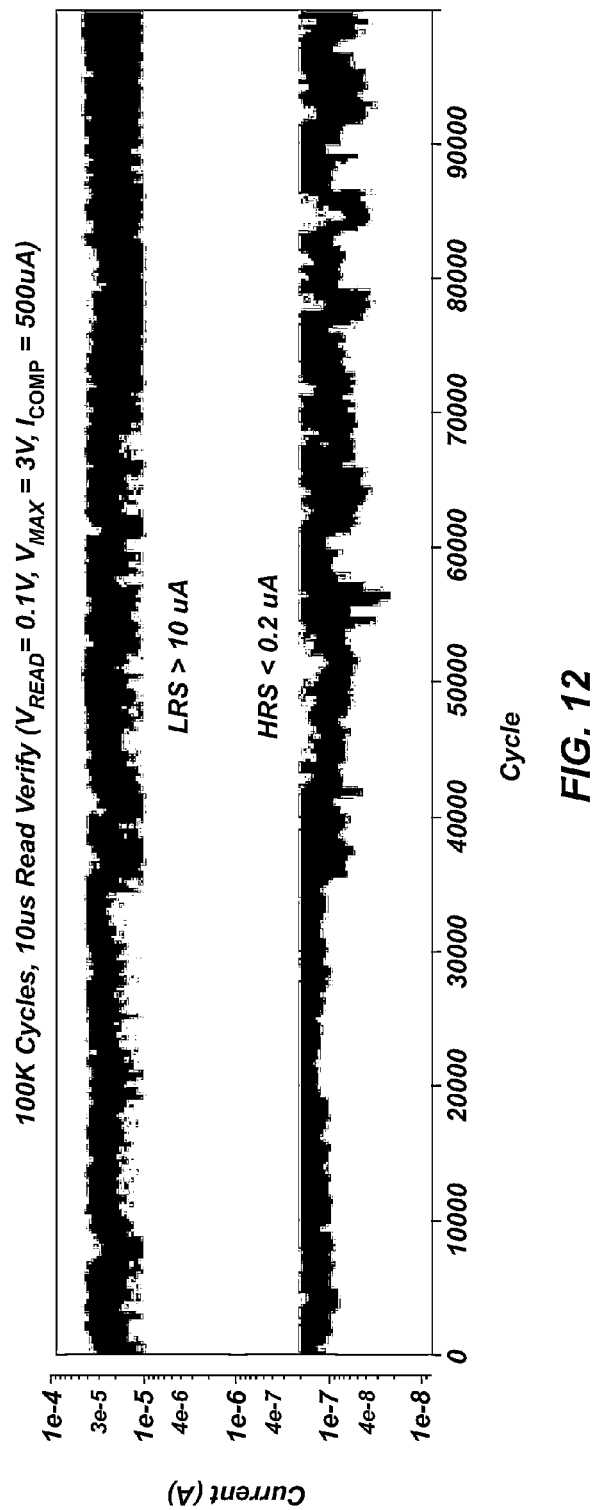
FIG. 12 is graph depicting results of switching endurance testing performed on a resistive memory device, as described below in Example 9.

Sample resistive memory devices including resistive memory elements each having an active material of zirconium oxide, an ion source material of copper (about 51 atomic percent), tellurium (about 34 atomic percent), and germanium (about 15 atomic percent) on the active material, and an electrode of tungsten silicide on the ion source material were subjected to switching endurance testing. The switching endurance test determines the number of times a memory cell is able to be switched between resistance states before operability of the memory cell is compromised. FIG. 12 is a graph illustrating the results of the testing. As depicted in FIG. 12, the sample resistive memory devices were able to be cycled between a low-resistance state ("LRS") and a high-resistance state ("HRS") over one hundred thousand times with an on/off resistance ratio of about 50x. The results indicate that the inclusion of germanium in the ion source material can enable mechanically stable memory cells exhibiting excellent switching endurance and high on/off resistance ratios.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A resistive memory element comprising:
   a conductive material;
   an active material over the conductive material; and
   an ion source material on the active material, the ion source material formulated to remain adhered to an electrode material on the ion source material up to a temperature of at least about 450° C., and comprising:
      at least one chalcogen;
      at least one active metal; and
      at least one additional element.

2. The resistive memory element of claim 1, wherein the ion source material is formulated to remain adhered to the active material up to the temperature of at least about 450° C.

3. The resistive memory element of claim 1, wherein the ion source material has an average coordination number within a range of from about 2.4 to about 2.7.

4. The resistive memory element of claim 1, wherein the at least one additional element is selected from the group consisting of Ti, Zr, Al, B, P, As, Be, Dy, Ga, Gd, Ge, and Si.

5. The resistive memory element of claim 4, wherein the at least one additional element comprises at least one of Ge, Ga, and Si present in the ion source material within a range of from about 2 atomic percent to about 20 atomic percent.

6. The resistive memory element of claim 4, wherein the at least one additional element comprises Al present in the ion source material within a range of from about 10 atomic percent to about 25 atomic percent.

7. The resistive memory element of claim 4, wherein the at least one additional element comprises at least one of Zr and Ti present in the ion source material within a range of from about 5 atomic percent to about 25 atomic percent.

8. The resistive memory element of claim 4, wherein the at least one additional element comprises B present in the ion source material within a range of from about 2 atomic percent to about 10 atomic percent.

9. The resistive memory element of claim 4, wherein the ion source material is homogeneous.

10. The resistive memory element of claim 4, wherein the ion source material is heterogeneous, and an amount of the at least one additional element at a location proximal the active material is greater than an amount of the at least one additional element at a location proximal the electrode material.

11. The resistive memory element of claim 1, wherein the at least one active metal is selected from the group consisting of Cu, Ag, and Zn.

12. The resistive memory element of claim 1, wherein the at least one active metal is present within the ion source material within a range of from about 10 atomic percent to about 80 atomic percent.

13. The resistive memory element of claim 1, wherein the at least one chalcogen is selected from the group consisting of S, Se, and Te.

14. The resistive memory element of claim 1, wherein the ion source material is formulated such that a major portion of the ion source material remains in a single phase up to a temperature of about 450° C.

15. A resistive memory element comprising:
   a conductive material;
   an active material over the conductive material;
   an ion source material over the active material and comprising at least one chalcogen and at least one active metal; and
   an interfacial material between the active material and the ion source material and formulated to keep the active material and the ion source material adhered to each other up to a temperature of at least about 450° C.

16. The resistive memory element of claim 15, further comprising another interfacial material between the ion source material and an electrode material overlying the ion source material, the another interfacial material formulated to keep the ion source material and the electrode material adhered to each other up to a temperature of at least about 450° C.

17. A method of forming a resistive memory element comprising:
   forming an active material on a conductive material; and
   forming an ion source material comprising at least one chalcogen, at least one active metal, and at least one additional element selected from the group consisting of Ti, Zr, Al, B, P, As, Be, Dy, Ga, Gd, Ge, and Si on the active material, the ion source material formulated to remain adhered, up to a temperature of at least about 450° C., to an electrode material to be formed on the ion source material.

18. The method of claim 17, wherein forming an ion source material comprises:
   depositing the ion source material; and
   thermally annealing the ion source material at a temperature below the glass transition temperature of the ion source material.

19. A resistive memory cell comprising:
   an access device; and
   a resistive memory element coupled to the access device and comprising:
      a conductive material;
      an active material over the conductive material; and
      an ion source material having an average coordination number within a range of from about 2.4 to about 2.7 over the active material and comprising at least one chalcogen, at least one active metal, and at least one additional element.

20. A resistive memory device, comprising:
a word line;
a bit line;
a source line; and
a resistive memory cell between the bit line and the source line and comprising:
   an access device coupled to the word line; and
   a resistive memory element between the access device and the bit line and comprising:
      a conductive material;
      an active material over the conductive material; and
      an ion source material between and in physical contact with the active material and the bit line, the ion source material comprising at least one chalcogen, at least one active metal, and at least one additional element, and formulated to remain adhered to each of the active material and the bit line up to a temperature of about 450° C.

21. The resistive memory element of claim 1, wherein the at least one additional element comprises Ge or Si.

22. The resistive memory element of claim 15, wherein the interfacial material comprises Ge.

\* \* \* \* \*